United States Patent [19]

Birkle

[11] Patent Number: 4,803,545
[45] Date of Patent: Feb. 7, 1989

[54] SELF-FIXTURING HEAT SINK
[75] Inventor: Alan D. Birkle, Palatine, Ill.
[73] Assignee: Motorola, Inc., Schaumburg, Ill.
[21] Appl. No.: 169,549
[22] Filed: Mar. 17, 1988
[51] Int. Cl.$^4$ ............................................. H01L 23/02
[52] U.S. Cl. ..................................... 357/81; 165/80.2;
174/16.3
[58] Field of Search .................... 357/81, 79; 165/80.2;
174/16 HS

[56] References Cited
U.S. PATENT DOCUMENTS
4,745,456 5/1988 Clemens ................................ 357/81

Primary Examiner—Andrew J. James
Assistant Examiner—Mark Prenty
Attorney, Agent, or Firm—John H. Moore

[57] ABSTRACT

A heat sink has a front side on which a plurality of transistors are situated and a back side in which groooves are formed, each groove being directly opposite a transistor. Two-legged clips each have one leg which holds a transistor against the heat sink and another leg that mates with one of the grooves. A ledge is formed on the front side of the heat sink to form a stop for the bottom edge of each transistor, and each groove terminates in a clip-stop ledge for positioning the leg of a clip. Optionally, a plurality of alignment tabs are formed on the ledge to assist in correctly positioning the transistors.

4 Claims, 1 Drawing Sheet

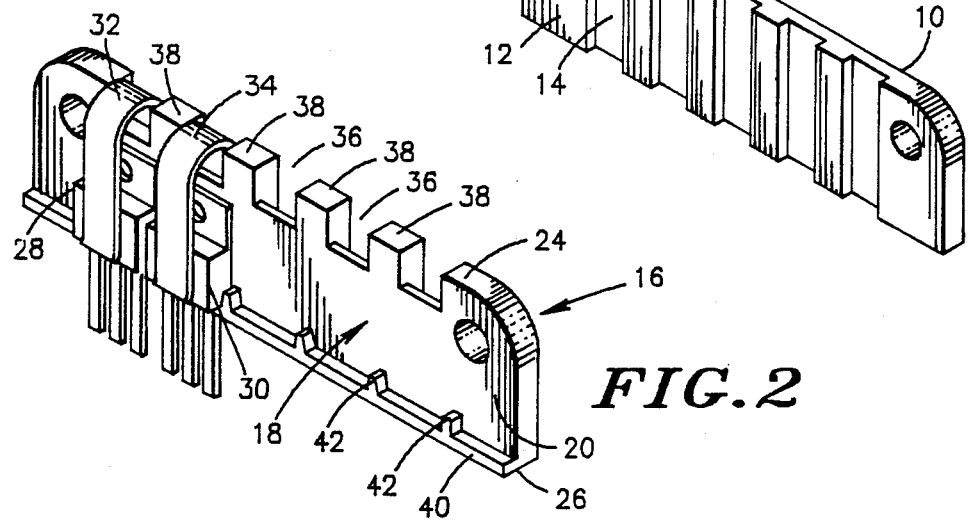
FIG. 1 —PRIOR ART—
FIG. 2
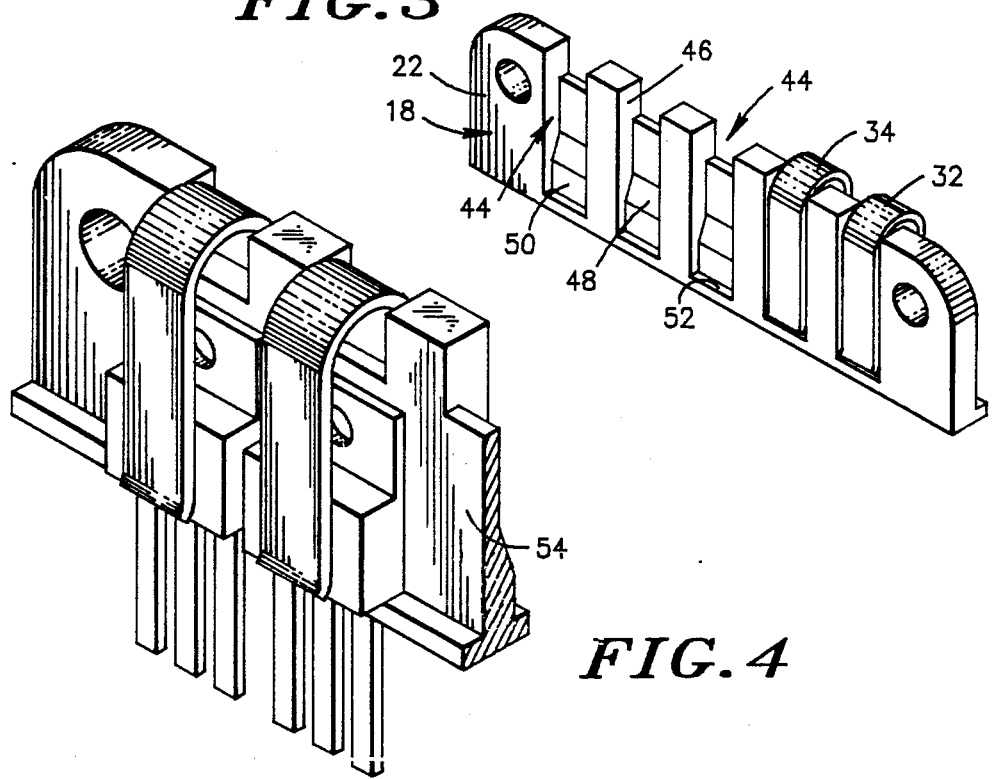
FIG. 3
FIG. 4

SELF-FIXTURING HEAT SINK

FIELD OF THE INVENTION

This invention relates to heat sinks for transistors, and particularly to heat sinks on which several transistors can be mounted.

BACKGROUND OF THE INVENTION

In some electronic circuit assemblies, several power transistors may be mounted on a single heat sink, such as the heat sink 10 shown in FIG. 1. This conventional heat sink includes a back side 12 having grooves 14. A spring clip (not shown) seats in each groove 14 for holding a transistor (not shown) firmly against the opposite flat side of the heat sink.

This type of heat sink arrangement has a drawback in that the positioning of the transistors and spring clips in relation to the heat sink 10 requires additional fixtures. Fixtures are needed to align and hold the transistors in their intended locations on the heat sink, while one or more additional fixtures position the spring clips. The requirement for such fixtures complicates the assembly operation and increases cost. Further, the fixtures themselves require maintenance.

OBJECTS OF THE INVENTION

It is a general object of the invention to provide an improved heat sink.

It is a more specific object of the invention to provide a heat sink that does not require all the fixtures mentioned above, while yet providing accurate positioning of transistors and the associated spring clips.

DESCRIPTION OF THE DRAWINGS

FIG. 1, previously referred to, shows a conventional heat sink for a plurality of transistors;

FIG. 2 is a perspective view showing the front side of a heat sink constructed according to the invention, including a pair of transistors held against the heat sink by conventional spring clips;

FIG. 3 is a perspective view of the rear side of the heat sink shown in FIG. 2; and FIG. 4 is a perspective view of an alternate heat sink constructed according to the invention.

DESCRIPTION OF THE PREFERRED EMBODIMENT

Referring now to FIGS. 2 and 3, a heat sink 16 is shown which is constructed according to the present invention. The illustrated heat sink is in the form of an elongated metal base member 18 that has a front side 20, a rear side 22 (FIG. 3), a top edge 24, and a bottom edge 26. As shown, the front side 20 of the heat sink has a substantially flat surface against which transistors are to be held. The illustrated embodiment is intended to hold five transistors, with each transistor held against the front side 20 of the heat sink at a pre-selected transistor site. In FIG. 2, two such transistors, 28 and 30, are shown positioned at their respective sites, leaving space for three additional transistors. The illustrated transistors are held in place by two-legged spring clips 32 and 34. One leg of each spring clip presses its associated transistor against the front side 20 of the heat sink, while the other leg grips the rear side of the heat sink. Cut-outs 36 in the top edge of the heat sink define upwardly extending posts 38 that separate the spring clips from each other, causing the top of each spring clip to be received in a cut-out 36. Typically, a thin, heat conductive electrical insulator (not shown) is situated between each transistor and the front surface of the heat sink.

To properly position each transistor and to hold each transistor at its assigned site during assembly, the heat sink includes a ledge 40 on the front side of the heat sink. Preferably, the ledge is substantially parallel to the bottom edge 26 of the heat sink and extends across the entire width of the heat sink. The ledge 40 is positioned such that the bottom surfaces of transistors 28 and 30 (and up to three additional transistors) abut the ledge 40 when they are vertically oriented at their proper positions. This eliminates the need for a fixture to position and hold the transistors at their designated sites.

Another alignment feature that is optional uses alignment tabs 42. These tabs 42 extend upwardly from the ledge 40 and are spaced apart from each other so as to properly locate a transistor at its site between adjacent alignment tabs. Thus each space between adjacent alignment tabs 42 constitutes a transistor site. During assembly, each transistor may be manually or automatically positioned between alignment tabs 42 and in engagement with the ledge 40. The spring clips 32, 34 will then be mated with the heat sink as discussed below.

The rear side of the heat sink (FIG. 3) includes a plurality of clip-leg sites in the form of grooves 44, each groove being constructed to receive one leg of a spring clip. Each such groove defines sidewalls 46 that contain the received leg of a spring clip, and a ramp surface 48. As the leg of a spring is inserted into a groove 44, the leg engages a ramp surface 48. Downward pressure exerted on the spring clip forces the inserted leg of the spring clip to follow the ramp surface 48 for opening the spring clip so that it can press against a flat surface 50 formed near the bottom of each groove 44.

Another feature of the invention provides additional assistance in properly locating the final position of each clip spring. This feature incorporates a clip-stop in each of the grooves 44 to insure that each clip leg received by a groove 44 comes to rest at the desired position. This is preferably accomplished by including a flat surface or ledge 52 in the bottom of each groove 44, each such surface 52 extending perpendicular to its associated groove. With this feature, each spring clip may be manually or automatically pressed downwardly so that one leg thereof fits into a groove 44, while the other leg grips a transistor as shown in FIG. 2. Downward pressure on the spring clip forces it to spread apart as it bears on the ramp surface 50, and then comes to rest on the clip-stop surface 52. This downward pressure on the spring clip does not move an engaged transistor because the latter device is held against further downward movement by the ledge 40.

As mentioned previously, the alignment tabs 42 (FIG. 2) comprise an optional feature. A heat sink 54 which does not include such alignment tabs is shown in FIG. 4. In all other respects, the heat sink 54 is preferably identical to the heat sink shown in FIGS. 2 and 3.

As discussed above, the advantage of the heat sink described herein is that the required fixturing for positioning and holding the transistors and spring clips correctly is an integral part of the heat sink itself. The entire heat sink, with its ledge, clip-stops and alignment tabs, can be constructed of a single molded or cast piece of metal. The disadvantages of external fixtures, plus the maintenance required for external fixtures are avoided by the heat sink described herein.

Although the heat sink has been described in terms of a preferred embodiment, it will be obvious to those skilled in the art that various alterations and modifications may be made without departing from the invention. Accordingly, it is intended that all such alterations and modifications be considered as within the true spirit and scope of the invention defined by the appended claims.

What is claimed is:

1. A heat sink for a plurality of transistors that are to be held on the heat sink by two-legged clips, comprising:

an elongated base member having a front side, a back side, and top and bottom edges, the front side having a substantially flat surface on which each transistor is to be held in place, at a pre-selected transistor site, by one leg of a clip, the back side of the base member being adapted to receive a plurality of clip legs at a corresponding plurality of clip-leg sites, each such clip leg site being positioned directly opposite a transistor site on the front side for receiving the other leg of the same clip that holds a transistor at said opposite transistor site;

a ledge formed on the front side of the base member, the ledge running substantially parallel to the bottom edge of the base member to form a stop for transistors situated at the transistor sites; and a clip-stop for each clip-leg site, each clip-stop being formed on the back side by a flat surface extending substantially parallel to the bottom edge of the base member.

2. A heat sink as set forth in claim 1 further including a plurality of alignment tabs formed on the ledge and spaced apart from each other for locating a transistor between adjacent tabs.

3. A heat sink as set forth in claim 1 wherein each clip-leg site is defined by a groove formed in the back side of the base member, each groove running from the top edge toward the bottom edge of the base member, and each groove communicating with a clip-stop.

4. A heat sink for a plurality of transistors that are to be held on the heat sink by two-legged clips, comprising:

an elongated base member having a front side, a back side, and top and bottom edges, the front side having a substantially flat surface on which each transistor is to be held in place, at a pre-selected transistor site, by one leg of a clip, the rear side of the base member having a plurality of grooves formed therein which run from the top edge of the base member toward the bottom edge of the base member, each groove being positioned to receive one leg of a clip;

a ledge formed on the front side of the base member, the ledge running substantially parallel to the bottom edge of the base member to form a stop for transistors situated at the transistor sites;

a plurality of alignment tabs formed on the ledge and spaced apart from each other to receive and position the transistors at the transistor sites; and a clip-stop for each groove, each clip-stop formed by a flat surface perpendicular to the grooves and situated in communication with a groove to act as a stop for a clip leg inserted into the groove.

* * * * *